(12) United States Patent
Vigier et al.

(10) Patent No.: US 11,143,746 B2
(45) Date of Patent: Oct. 12, 2021

(54) CHIRP LINEARITY DETECTOR FOR RADAR

(71) Applicant: NXP USA, Inc., Austin, TX (US)

(72) Inventors: Jean-Stéphane Vigier, Mondonville (FR); Dominique Delbecq, Fonsorbes (FR); Cristian Pavao-Moreira, Frouzins (FR); Andres Barrilado-Gonzalez, Toulouse (FR)

(73) Assignee: NXP USA, Inc., Austin, TX (US)

( * ) Notice: Subject to any disclaimer, the term of this patent is extended or adjusted under 35 U.S.C. 154(b) by 349 days.

(21) Appl. No.: 15/999,181

(22) Filed: Aug. 17, 2018

(65) Prior Publication Data
US 2020/0057140 A1 Feb. 20, 2020

(30) Foreign Application Priority Data
Feb. 27, 2018 (EP) ..................................... 18305208

(51) Int. Cl.
| | | |
|---|---|---|
| *G01S 7/40* | (2006.01) | |
| *H03L 7/08* | (2006.01) | |
| *G01S 7/52* | (2006.01) | |

(52) U.S. Cl.
CPC .......... *G01S 7/4056* (2013.01); *G01S 7/5203* (2013.01); *H03L 7/0805* (2013.01)

(58) Field of Classification Search
CPC ..... G01S 7/4056; G01S 7/5203; H03L 7/0805
See application file for complete search history.

(56) References Cited

U.S. PATENT DOCUMENTS

| | | | |
|---|---|---|---|
| 4,238,727 | A | 12/1980 | Madni |
| 4,442,412 | A | 4/1984 | Smith et al. |
| 4,754,277 | A | 6/1988 | Voyce |
| 4,968,968 | A | 11/1990 | Taylor |
| 6,265,861 | B1 | 7/2001 | Musha |

(Continued)

FOREIGN PATENT DOCUMENTS

| | | |
|---|---|---|
| EP | 0 427 206 A2 | 9/1989 |
| GB | 2 165 425 A | 4/1986 |
| GB | 2 283 379 A | 3/1995 |

OTHER PUBLICATIONS

European Search Report dated Aug. 9, 2018 European Counterpart Application No. EP 18305208.3, 9 pgs.

*Primary Examiner* — Donald H B Braswell (57) ABSTRACT

A chirp linearity detector, integrated circuit, and method are provided. The chirp linearity detector comprises a phase-locked loop (PLL) frequency sampling circuit and a frequency sweep linearity measuring circuit. The PLL frequency sampling circuit comprises a frequency divider circuit for receiving a PLL output signal from a PLL and for providing a frequency divided output signal, a first low pass filter circuit for receiving the frequency divided output signal, for reducing harmonic mixing, and for providing a mixer input signal, a mixer circuit for receiving the mixer input signal, for mixing the mixer input signal with a local oscillator signal, and for providing a mixer output signal, a second low pass filter circuit for performing anti-aliasing filtering and for providing an analog-to-digital converter (ADC) input signal, and an ADC circuit for digitizing the ADC input signal and for providing a digital output signal.

20 Claims, 8 Drawing Sheets

(56) References Cited

U.S. PATENT DOCUMENTS

| | | | |
|---|---|---|---|
| 8,503,507 B2* | 8/2013 | Kianush | H04B 1/30 |
| | | | 375/147 |
| 8,553,827 B2 | 10/2013 | Zhang | |
| 2008/0284531 A1* | 11/2008 | Hornbuckle | H03L 7/1976 |
| | | | 331/1 A |
| 2012/0194169 A1* | 8/2012 | Smith | G01R 13/0254 |
| | | | 324/76.41 |
| 2017/0045607 A1 | 2/2017 | Bharadwaj et al. | |
| 2018/0267159 A1* | 9/2018 | Wada | G01S 7/35 |

\* cited by examiner

CHIRP LINEARITY DETECTOR FOR RADAR

CROSS-REFERENCE TO RELATED APPLICATION(S)

The present application claims priority to European Application No. EP 18305208.3, entitled "CHIRP LINEARITY DETECTOR FOR RADAR" filed on Feb. 27, 2018, the entirety of which is herein incorporated by reference.

BACKGROUND

Field of the Disclosure

In radar applications, a pulse of electromagnetic energy is transmitted by a transmitter, reflected by a target, received by a receiver, and processed to provide information about the target. Since a very short radar pulse would have very little energy, making its reflections very weak and difficult to detect, a radar pulse has a duration sufficient to deliver enough energy over that duration to obtain reflections of observable energy. However, increasing the duration of a radar pulse at a single frequency would create temporal ambiguity, and therefore, spatial ambiguity since a portion of a reflection of the beginning of the radar pulse would be indistinguishable from a portion of the reflection of the middle or end of the radar pulse.

To improve temporal resolution, and, therefore, spatial resolution, a technique of modulating a radar pulse, referred to as chirp radar, has been used. In chirp radar, instead of a radar pulse having the same characteristics over its duration, a characteristic is changed during the transmission of the radar pulse. In frequency modulated continuous wave (FMCW) radar, the frequency of the transmitted radar signal is changed continuously and typically linearly over at least a portion of the radar pulse. The swept frequency of a FMCW radar is often referred to as a chirp.

The chirp of FMCW radar provides pulse compression, effectively shortening, from the perspective of temporal resolution, the duration of a radar pulse while allowing the actual duration of the transmitted radar pulse to remain long enough to provide enough energy for observable reflections. The effective shortening is achieved by the reflections of different portions of the transmitted radar pulse returning at their respective different frequencies. By considering the frequencies over time of the reflections when correlating the reflections to the transmitted radar pulse, the timing of the reflections can be determined with greater accuracy, allowing the position of the target to be determined with greater accuracy. Moreover, in a crowded environment, with many targets returning reflections, chirp radar improves the observability of the reflections of the many targets. Thus, chirp radar can provide performance advantages, but those advantages are lost if the chirps are not properly formed. Moreover, reliance on an assumption that the chirps are properly formed without verification of the same can introduce risks into a system.

Because chirp radar relies on the characteristics of its chirped radar pulses, or chirps, to deliver its improved performance, a failure to deliver chirps having the proper characteristics would be detrimental to the performance of a chirp radar system. While chirp radars have traditionally been operated under the assumption that the characteristics of the chirps are appropriate without any way to confirm that assumption on an ongoing basis, reliability of chirp radar could be improved if a technique were developed to monitor a chirp characteristic while a chirp radar is in operation.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A chirp linearity detector, integrated circuit, and method are described. The chirp linearity detector, integrated circuit, and method provide an ability to monitor the manner in which the frequency of a radar pulse is swept as a chirp.

Functional safety of a system is desirable to mitigate risks. A safety mechanism is implemented to track the linearity of a phase-locked loop (PLL) generating a radio frequency (RF) chirp. This linearity detector includes a frequency divider followed by a mixer. By moving the chirp to a lower range of frequencies, the frequency ramp quality of the chirp can be tracked using a low frequency signal, which can avoid the typically complicated nature of higher frequency circuitry. The goal of this implementation is to scale down the chirp in a low frequency band (2 to 4 MHz) in order to be able to sample it with an analog-to-digital converter (ADC), and in order to avoid having harmonics of the signal in the analyzed band.

In accordance with at least one embodiment, a PLL inside the front-end IC outputs a chirp. A chirp is a sweep of frequencies in time. Adherence of the chirp to an expected frequency sweep characteristic, such as linearity of the frequency sweep of the chirp can significantly affect performance of the system. Accordingly, technology described herein can allow measurement of characteristics of the frequency sweep of a chirp, such as chirp linearity, within an operating radar system.

Figure 1:
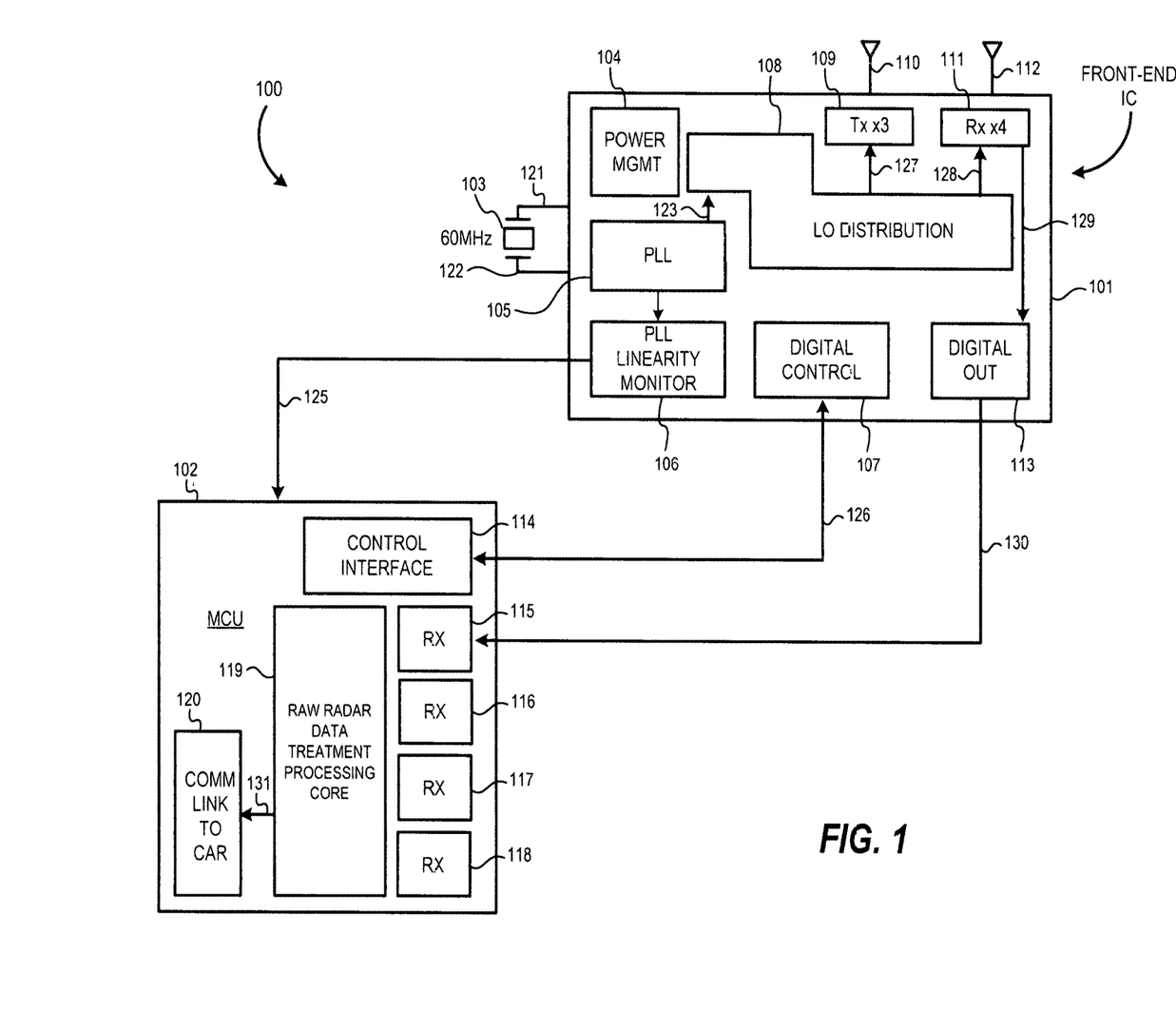
FIG. 1 is a block diagram illustrating a chirp radar system in accordance with at least one embodiment.

FIG. 1 is a block diagram illustrating a chirp radar system in accordance with at least one embodiment. Chirp radar system 100 comprises a front-end integrated circuit (IC) 101, a microcontroller unit (MCU) 102, a frequency reference signal source 103, a transmit antenna 110, and a receive antenna 112. Front-end IC 101 comprises a power management circuit 104, a phase-locked loop (PLL) 105, a PLL linearity monitor 106, a digital control circuit 107, a local oscillator (LO) distribution circuit 108, a transmitter circuit 109, a receiver circuit 111, and a digital output circuit 113. Transmitter circuit 109 is connected to transmit antenna 110. Transmitter circuit 109 provides transmit signals to transmit antenna 110 to be transmitted toward one or more radar targets. Receive antenna 112 is connected to receiver circuit 111. Reflected radar return signals provided by receive antenna 112 to receiver circuit 111. Frequency reference signal source 103 is connected to front-end IC 101. Frequency reference signal source, which may, for example, be a stable oscillator, such as a crystal oscillator or another stable oscillator, provides a frequency reference signal to elements of front-end IC 101, such as PLL 105. The frequency reference signal can be used to generate other frequencies used within chirp radar system 100.

Power management circuit 104 manages the application of electric power to the circuits of front-end IC 101. By managing the application of electric power to transmitter circuit 109, power management circuit 104 can control an output power radiated by transmitter circuit 109 via transmit antenna 110. PLL 105 can synthesize frequencies used within chirp radar system 100 based on the frequency reference signal. PLL 105 can provide a LO frequency to LO distribution circuit 108 via interconnection 123. LO distribution circuit 108 can provide a LO frequency, such as a transmitter LO frequency, to transmitter circuit 109 via interconnection 127. LO distribution circuit 108 can provide a LO frequency, such as a receiver LO frequency, to receiver circuit 111. Receiver circuit 111 can provide a received signal to digital output circuit 113 via interconnection 129.

MCU 102 is a circuit comprising a microcontroller core. The microcontroller core can be used to implement raw radar data treatment 119. MCU 102 further comprises control interface 114, one or more receivers 115, 116, 117, and 118, and communication link circuit 120, which may, for example, provide a communication link to a vehicle, such as a car or other vehicle. Control interface 114 is connected to digital control circuit 107 of front-end IC 101 via control interconnection 126. Digital output circuit 113 provides a digital received signal to receiver 115 of MCU 102 via digital receive interconnection 130. PLL 105 provides a PLL output to PLL linearity monitor 106 via PLL output interconnection 124. PLL linearity monitor 106 provides a frequency detection output to MCU 102 via frequency detection interconnection 125.

Receiver 115 provides a received signal for raw radar data treatment 119, for example, using a microcontroller core of MCU 102. Processed radar data from raw radar data treatment is provided to communication link circuit 120 via interconnection 131.

Figure 2:
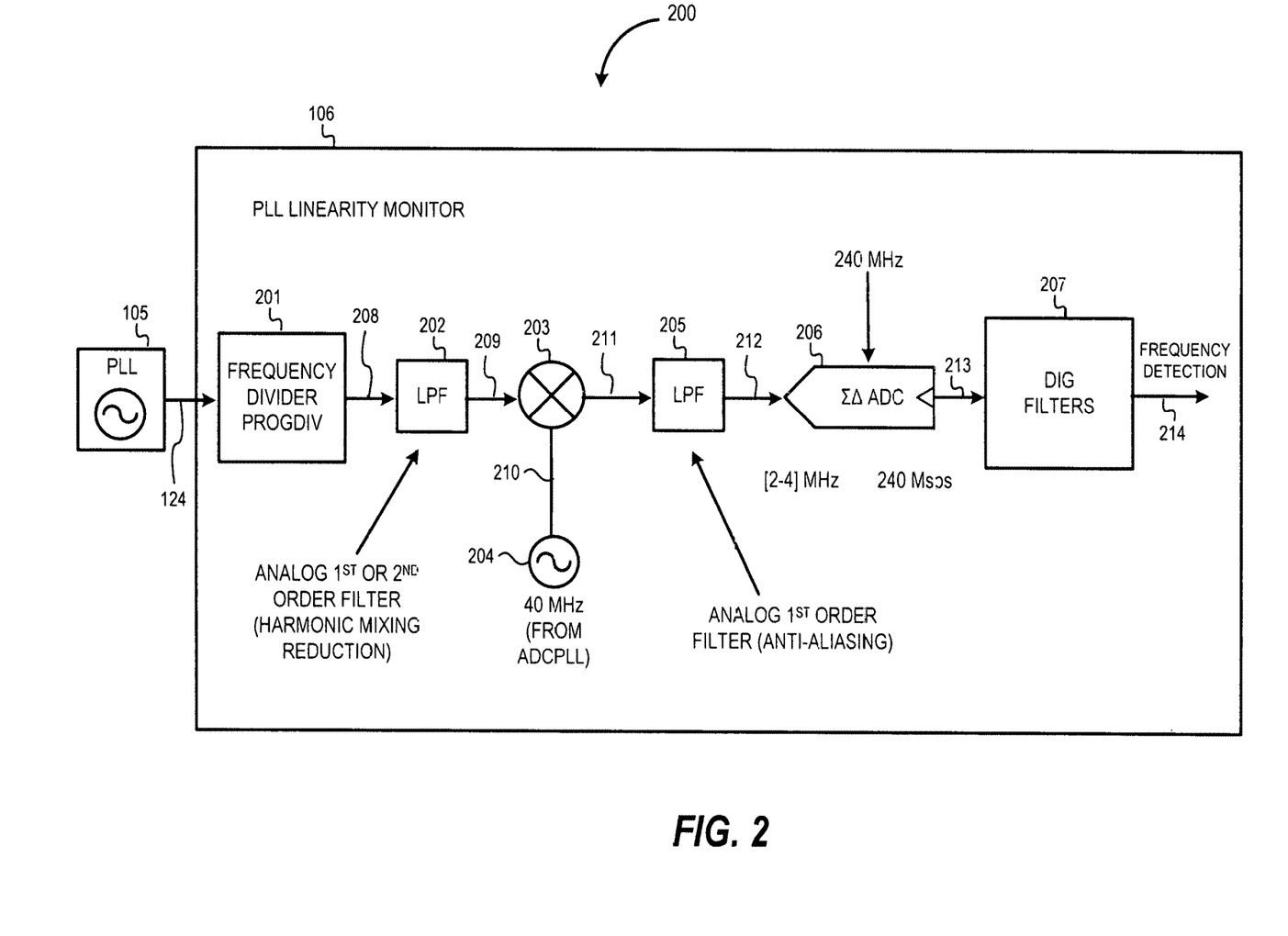
FIG. 2 is a block diagram illustrating a chirp linearity monitor in accordance with at least one embodiment.

FIG. 2 is a block diagram illustrating a chirp linearity monitor in accordance with at least one embodiment. Chirp linearity monitor 200 comprises PLL linearity monitor 106, which receives a PLL output signal from PLL 105 via PLL output interconnection 124, which is connected to frequency divider circuit 201. While PLL linearity monitor 106 is described with respect to a PLL output signal from PLL 105 via PLL output interconnection 124, it should be understood that chirp linearity monitor 200 may be implemented with respect to other types of signal sources besides a PLL. Frequency divider circuit 201 provides a frequency divided output signal to low pass filter (LPF) circuit 202 via frequency divided output 208. Significantly, frequency divider circuit 201 is programmable to allow programming of the value of the divisor it uses to perform the frequency division. The programmability of frequency divider circuit 201 allows precise scaling of the swept frequency range of the PLL output signal at PLL output interconnection to fit an analog-to-digital converter (ADC) frequency range of ADC 206. LPF circuit 202 receives the frequency divided output signal, reduces harmonic mixing by filtering out harmonic spectral content, and provides a mixer input signal at mixer input 209 to mixer 203. Local oscillator (LO) 204 provides a LO signal to mixer 203 via mixer LO input 210. Mixer 203 provides a mixer output signal at mixer output 211 to LPF circuit 205. LPF circuit 205 receives the mixer output signal, performs anti-aliasing filtering, and provides an ADC input signal at ADC input 212 to ADC 206. ADC circuit 206 receives the ADC input signal, digitizes the ADC input signal, and provides a digital output signal at ADC output 213 to digital filters 207. Digital filters 207 receive the digital output signal and detect frequencies of a swept frequency chirp. Digital filters 207 provide a frequency detection output signal at frequency detection output 214.

In accordance with at least one embodiment, a chirp at a higher frequency (e.g., around 80 GHz) and having a wider bandwidth (e.g., 2 GHz) is scaled into a frequency range detectable by an ADC (e.g., at or near baseband). Even with a carefully chosen frequency plan, harmonic mixing is a concern. Accordingly, a lower-order (e.g., $1^{st}$ or $2^{nd}$ order) filter is added at the input of a mixer used for frequency downconversion to prevent harmonic mixing products from interfering with the desired downconverted signals. By keeping the signals sufficiently spectrally separated, harmonics can be filtered in baseband (e.g., within the PLL linearity monitor circuits). A first minimum value of a first frequency difference between a fundamental frequency band and a LO fundamental frequency and a second minimum value of a second frequency difference between a $2^{nd}$ harmonic frequency band and a LO $2^{nd}$ harmonic frequency can be established ensure correct operation of a demodulator.

Figure 3:
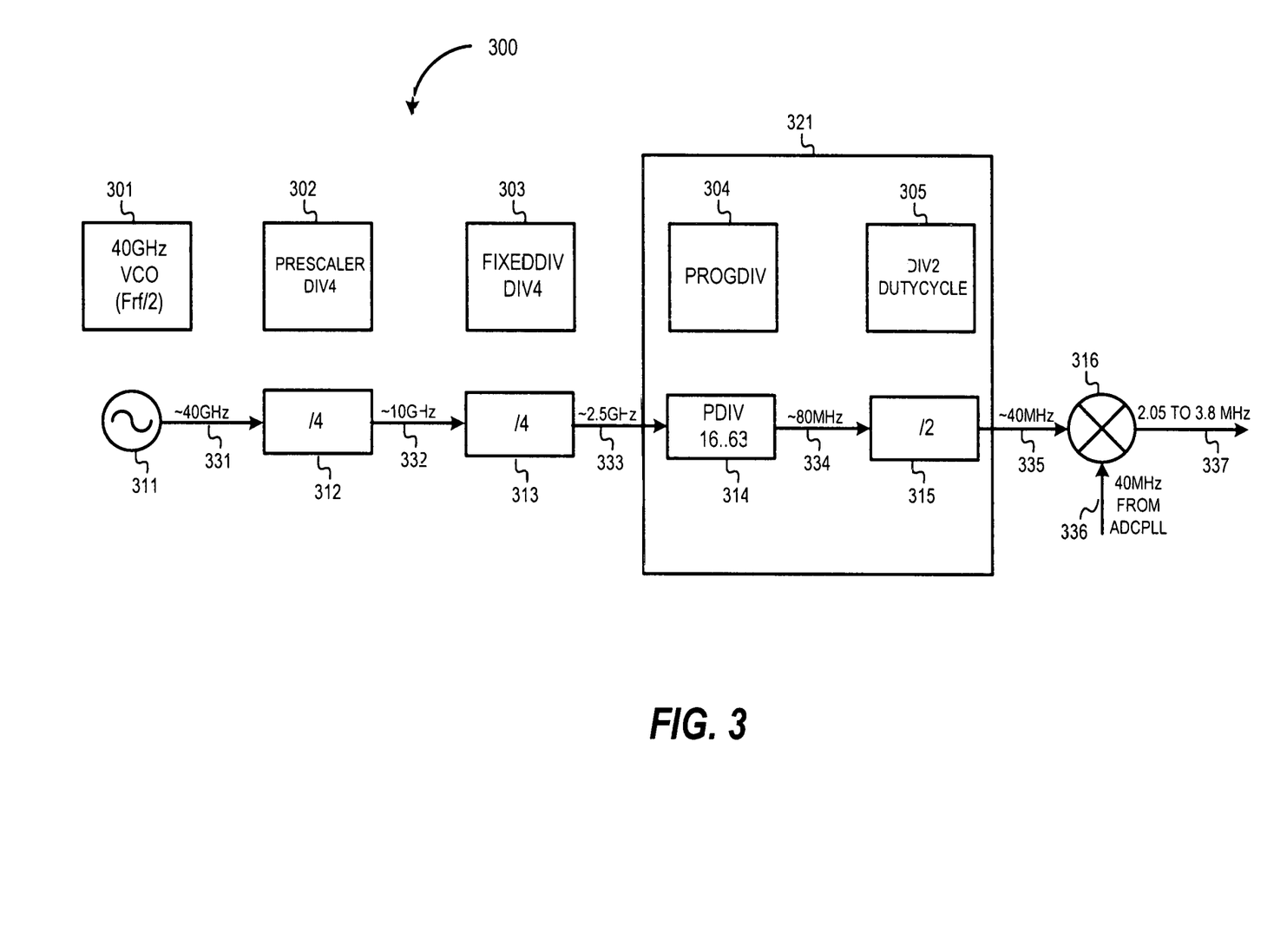
FIG. 3 is a block diagram illustrating a signal chain for a chirp linearity monitor comprising a prescaler in accordance with at least one embodiment.

FIG. 3 is a block diagram illustrating a signal chain for a chirp linearity monitor in accordance with at least one embodiment. As an example, the chirp linearity monitor may be implemented as a PLL linearity monitor. Signal chain 300 scales higher frequency (e.g., ~40 GHz) to a lower frequency (e.g., ~40 MHz) through frequency division then applies the lower frequency, along with a local oscillator (LO) frequency close to, but slightly different from, the lower frequency, to mixer 316. Mixer 316 mixes the signal to produce mixing products in an ADC frequency range (e.g., 2 to 4 MHz) compatible with an input of an ADC. Accordingly, the ADC can obtain an accurate representation of the swept frequencies of the higher frequency signal even though the higher frequency signal is much too high in frequency for the ADC to sample directly. Signal chain 300 comprises a voltage-controlled oscillator (VCO) 301 instantiated as signal source 311, a prescaler 302 instantiated as frequency divider 312, a frequency divider 303 instantiated as frequency divider 303, a programmable frequency divider 304 instantiated as programmable frequency divider 314, a duty cycle adjustment circuit 305 instantiated as divide-by-2 frequency divider 315, and a mixer 316. PLL 105 of FIG. 1 may, for example, comprise VCO 301. Signal conditioning block 321 comprises programmable frequency divider 304 instantiated as programmable frequency divider 314 and duty cycle adjustment circuit 305 instantiated as divide-by-2 frequency divider 315.

Signal source 311 provides a VCO output signal at VCO output 331. VCO output 331 is connected to an input of frequency divider 312. Frequency divider 312 provides a prescaler output signal at prescaler output 332. Prescaler output is connected to an input of frequency divider 313. Frequency divider 313 provides a frequency divider output signal at frequency divider output 333. Frequency divider output 333 is connected to an input of programmable divider 314. Programmable divider 314 provides a programmable divider output signal at programmable divider output 334. Programmable divider output 334 is connected to an input of duty cycle adjustment circuit 315. Duty cycle adjustment circuit 315 provides a mixer input signal at mixer input 335. Mixer input 335 is connected to an input of mixer 316. A LO signal, such as an ADC PLL output signal, is provided at mixer LO input 336. Mixer LO input 336 is connected to mixer 316. Mixer 316 provides a mixer output signal at mixer output 337. Mixer LO input 336 can be provided with the same LO signal as the LO signal at mixer LO input 210 of FIG. 2, which may be the same LO signal as the LO signal at LO input 538 of FIG. 5.

In accordance with at least one embodiment, VCO 301 may operate, for example, at a frequency of half of the radar frequency. For a radar system operating around 80 gigahertz (GHz), for example, VCO 301 may have a frequency of around 40 GHz. Prescaler 302 may, for example, be a divide-by-four frequency divider to provide a signal at around 10 GHz at prescaler output 332. Frequency divider 313 may be, for example, a fixed frequency divider, such as a divide-by-four frequency divider to provide a signal at around 2.5 GHz at frequency divider output 333. Programmable frequency divider 314 may be, for example, a programmable frequency divider 314 having a divisor programmable between, for example, 16 and 63. If a value around 32 is chosen for a divisor, for example, programmable frequency divider 314 can provide a programmable frequency divider output of around 80 MHz. Duty cycle adjustment circuit 315 can provide a mixer input signal of half of its input, providing, according to the exemplary values, a mixer input signal around 40 MHz. An LO frequency source, such as an ADC PLL, can provide another frequency around 40 MHz but offset by a few MHz to allow the mixer to provide a mixing product of around 2.05 to 3.08 MHz at mixer output 337. Other embodiments may be practiced with other frequencies and details.

The PDIV (314) element allows fine-tuning the divide-by factor to almost match that of the ADC PLL frequency in such way that the output from the mixer is between 2 and 3.8 MHz, which is an ADC-compatible frequency range. Since the ADC, in an exemplary case, runs at 10 megasamples per second (MSps), the Nyquist criteria is fulfilled (e.g., the sampling frequency shall be at least twice that of the incoming signal).

A desired frequency range relationship in baseband can be achieved by using a programmable frequency divider. The division ratio (and thus the divisor) can be set in accordance with the modulation frequency. The frequency divider can use a prescaler and a fixed-divisor frequency divider down to 2.5 GHz. For example, the operational RF (e.g., radar) frequency can be divided by a prescaler and a fixed-divisor frequency divider down to a moderately low frequency, such as 2.5 GHz, then the programmable frequency divider can be programmed to an appropriate divisor (e.g., 32) within a divisor range (e.g., 16 to 63) of the programmable frequency divider. After frequency division according to the programmable frequency divider's programmed divisor, a divide-by-two frequency divider can be used to adjust the duty cycle of the resulting signal to 50% on and 50% off.

As an example, programmable divider with a 2.5 GHz input frequency can be implemented as a dynamic CMOS device. By obtaining a 50% duty cycle using the divide-by-two frequency divider on the output of the programmable frequency divider, harmonic rejection is obtained (as a duty cycle other than 50% could be expected to produce spectral energy at frequencies related to the on-time and off-time of the non-50% duty cycle).

The output of the divide-by-two frequency divider may be mixed down to a low frequency range (at or near baseband) to allow sampling within the bandwidth capability of an ADC. For example, the targeted IF frequency range at divider output may be in the range 2 MHz to 4 MHz.

Depending on the operational RF frequency (e.g., radar frequency), a programmable divisor value can be selected to provide coverage of the range of frequencies over which a chirp signal may be swept (e.g., over a 2 GHz RF band). A selected divisor can produce, different positive IF and negative IF values.

Figure 4:
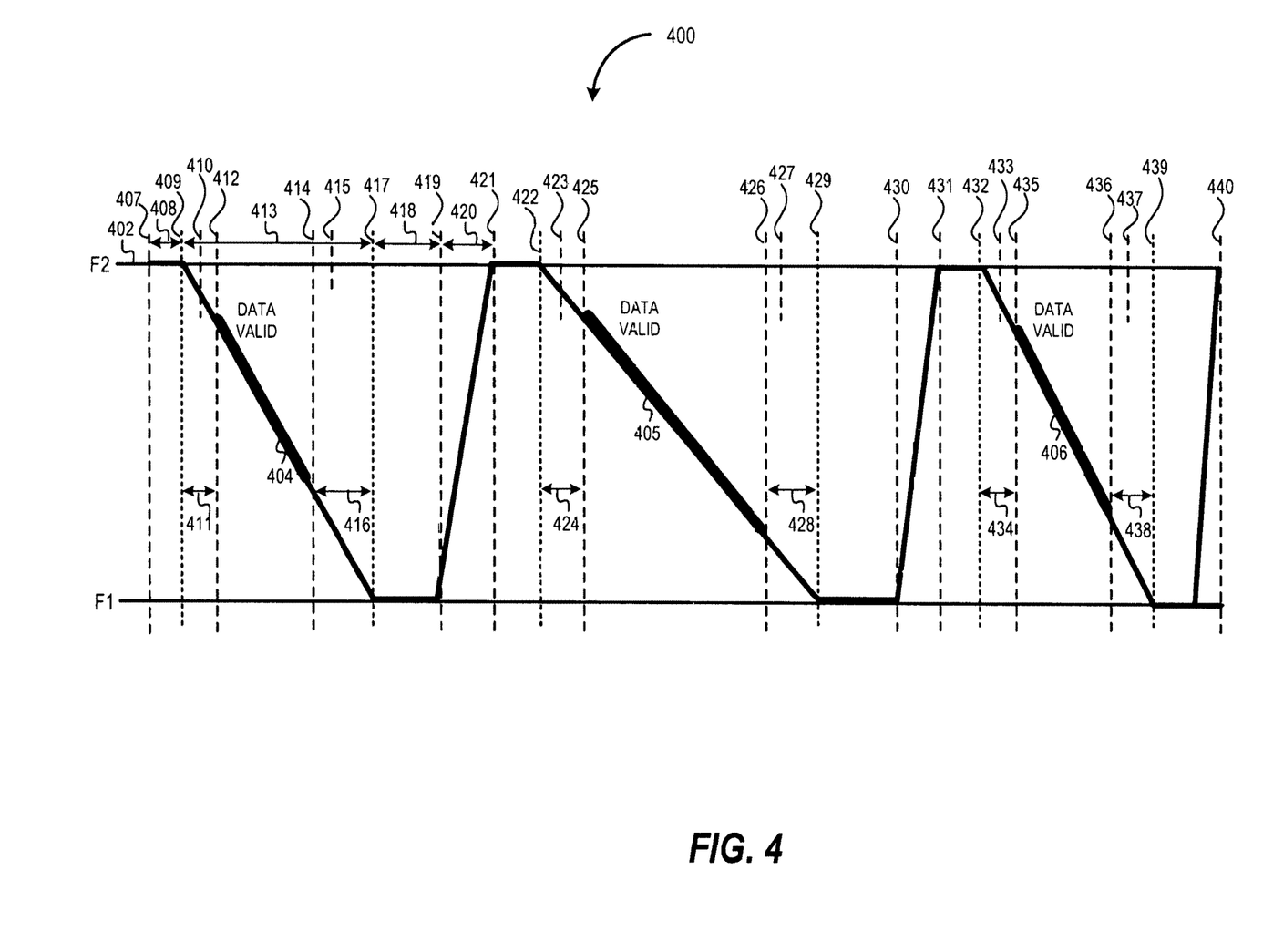
FIG. 4 is a timing diagram illustrating a waveform for a chirp radar system in accordance with at least one embodiment.

FIG. 4 is a timing diagram illustrating a waveform for a chirp radar system in accordance with at least one embodiment. Waveform diagram 400 is drawn in two dimensions, with time on the horizontal axis and frequency on the vertical axis. Waveform 403 varies between a first frequency (F1) 401 and a second frequency (F2) 402.

At time 407, waveform 403 is at second frequency 402, where it remains for a duration 408 until time 409. At time 409, waveform 403 begins to decrease in frequency through time 410 and thereafter until, after a duration 411, a period of valid data 404 begins at time 412. The period of valid data 404 continues until time 414, although waveform 403 continues to decrease in frequency for an additional duration 416, past time 415, until time 417. At time 417, waveform 403 is at first frequency 401, where it remains for a duration 418 until time 419. From time 419 to time 421, for a duration 418, waveform 403 rapidly increases in frequency from first frequency 401 to second frequency 402.

At time 421, waveform 403 is at second frequency 402, where it remains until time 422. At time 422, waveform 403 begins to decrease in frequency through time 423 and thereafter until, after a duration 424, a period of valid data 405 begins at time 425. The period of valid data 405 continues until time 426, although waveform 403 continues to decrease in frequency for an additional duration 428, past time 427, until time 429. At time 429, waveform 403 is at first frequency 401, where it remains until time 430. From time 430 to time 431, waveform 403 rapidly increases in frequency from first frequency 401 to second frequency 402.

At time 431, waveform 403 is at second frequency 402, where it remains until time 432. At time 432, waveform 403 begins to decrease in frequency through time 433 and thereafter until, after a duration 434, a period of valid data 406 begins at time 435. The period of valid data 406 continues until time 436, although waveform 403 continues to decrease in frequency for an additional duration 438, past time 437, until time 439. At time 439, waveform 403 is at first frequency 401, where it remains for a brief time, after which waveform 403 rapidly increases in frequency from first frequency 401 to second frequency 402, arriving at second frequency 402 at time 440.

Waveform 403 represents the PLL output from the PLL. First frequency 401 and second frequency 402 represent the start and end frequencies of a chirp. The rate of change for the frequency slope during the active part of a chirp (when data are valid) can be used to obtain a measurement of the characteristic (e.g., linearity) by which the frequency changes to implement the chirp.

Figure 5:
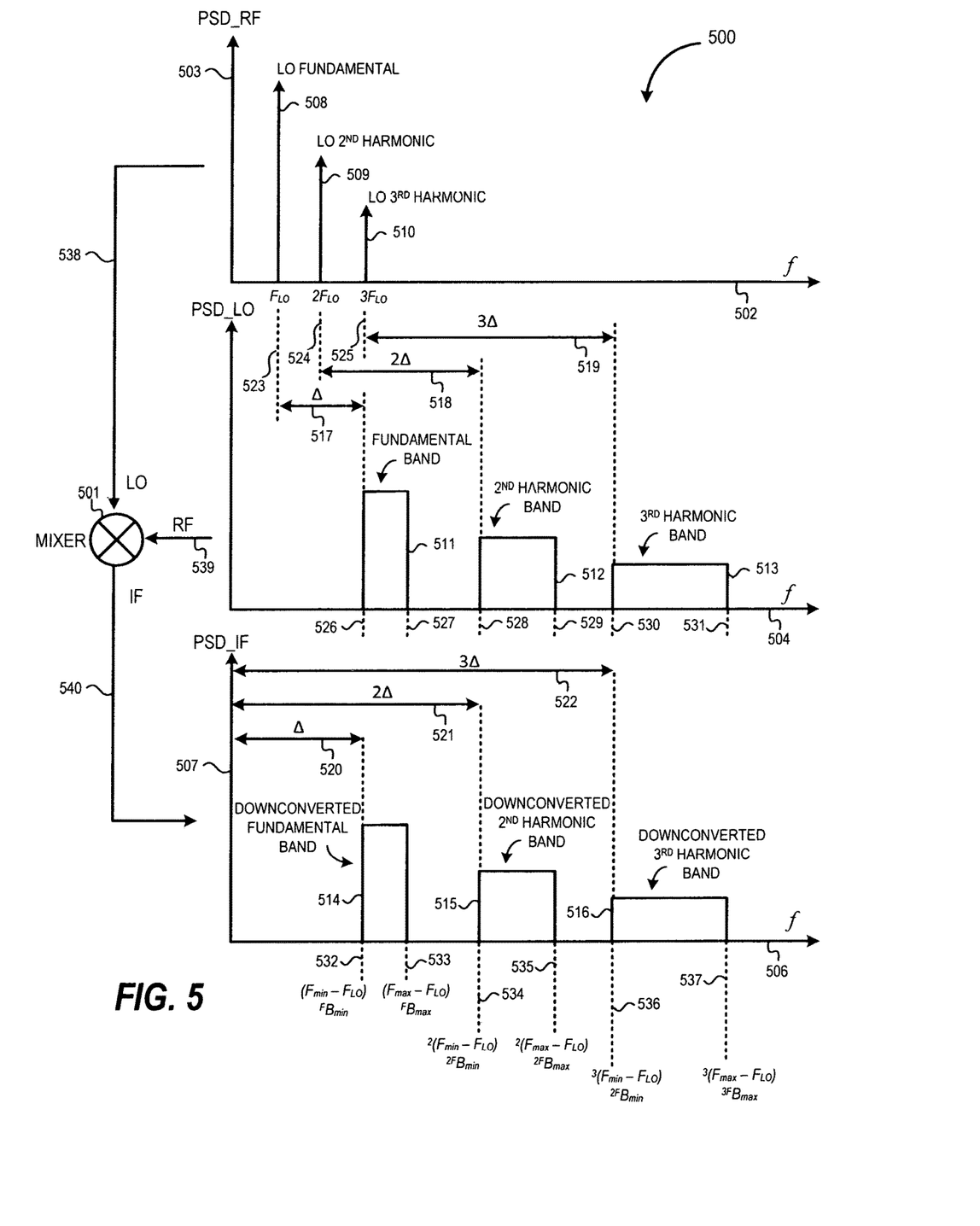
FIG. 5 is a frequency domain diagram illustrating spectral content of a local oscillator (LO) signal, a radio frequency (RF) signal, and an intermediate frequency (IF) signal of a chirp linearity monitor in accordance with at least one embodiment.

FIG. 5 is a frequency domain diagram illustrating spectral content of a local oscillator (LO) signal, a radio frequency (RF) signal, and an intermediate frequency (IF) signal of a chirp linearity monitor in accordance with at least one embodiment. Frequency plan 500 includes a frequency domain graph of a LO signal, with frequency plotted on horizontal axis 502 and amplitude plotted on vertical axis 503, a frequency domain graph of a RF signal, with frequency plotted on horizontal axis 504 and amplitude plotted on vertical axis 505, and a frequency domain graph of a IF signal, with frequency plotted on horizontal axis 506 and amplitude plotted on vertical axis 507. The LO signal is provided to an LO input 538 of mixer 501. The RF signal is provided to a RF input 539 of mixer 501. The mixing products of mixer 501 are provided at IF output 540 of mixer 501. LO input 538 can be provided with the same LO signal as the LO signal at mixer LO input 210 of FIG. 2, which may be the same LO signal as the LO signal at mixer LO input 336 of FIG. 3.

On the frequency domain graph of the LO signal, a LO fundamental frequency 508, a LO $2^{nd}$ harmonic frequency 509, and a LO $3^{rd}$ harmonic frequency 510 are depicted. On the frequency domain graph of the RF signal, a fundamental frequency band 511, a $2^{nd}$ harmonic frequency band 512, and a $3^{rd}$ harmonic frequency band 513 are depicted. Fundamental frequency band 511 extends from a lower frequency 526 to an upper frequency 527. Second harmonic frequency band 512 extends from a lower frequency 528 to an upper frequency 529. Third harmonic frequency band 513 extends from a lower frequency 530 to an upper frequency 531. Fundamental frequency band 511 has its beginning situated at a frequency difference 517 from LO fundamental frequency 523. Second harmonic frequency band 512 has its beginning situated at a frequency difference 518 from LO $2^{nd}$ harmonic frequency 524. Third harmonic frequency band 513 has its beginning situated at a frequency difference 519 from LO $3^{rd}$ harmonic frequency 525.

On the frequency domain graph of the IF signal, a downconverted fundamental frequency band 514, a downconverted $2^{nd}$ harmonic frequency band 515, and a downconverted $3^{rd}$ harmonic frequency band 516 are depicted. Downconverted fundamental frequency band 514 extends from a lower frequency 532 to an upper frequency 533. Downconverted $2^{nd}$ harmonic frequency band 515 extends from a lower frequency 534 to an upper frequency 535. Downconveted $3^{rd}$ harmonic frequency band 516 extends from a lower frequency 536 to an upper frequency 537. Downconverted fundamental frequency band 514 has its beginning situated at a frequency difference 520 from a direct current (DC) (zero Hertz) frequency. Downconverted $2^{nd}$ harmonic frequency band 515 has its beginning situated at a frequency difference 521 from a DC (zero Hertz) frequency. Downconverted $3^{rd}$ harmonic frequency band 516 has its beginning situated at a frequency difference 52 from a DC (zero Hertz) frequency.

The signals for which the graphs are shown in FIG. 5 are the signals present at mixer's ports. The graphs show the harmonic mixing phenomenon that can occur between the RF and local oscillator (LO) signals. Due to the frequency planning, only direct harmonic mixing may result in mixing products around direct current (DC) (zero Hertz). Cross-mixed products will be far away from DC (≥40 MHz), so they'll be filtered out by the anti-aliasing filters.

To select frequencies whose harmonic mixing products may be filtered at baseband, values are selected according to the following equations:

For the 2nd Harmonic, $$2F\text{min} \geq F\text{max}$$

The bandwidth of the signal recovered at baseband frequencies can be expressed as follows:

$$BW\text{max-baseband} \approx 1 \text{ MHz}$$

The division ratio used to go from ~38 GHz to ~40 MHz can be approximated by ~1000. The maximum bandwidth at 38 GHz is equal to 1 GHz (in the case where the maximum bandwidth at ~76 GHz is 2 GHz). It therefore leads to a bandwidth at 40 MHz equal to ~1 MHz.

The following relationships can therefore be obtained:

$$F\text{max} = F\text{min} + BW\text{max-baseband} \rightarrow 2F\text{min} \geq F\text{min} + BW\text{max-baseband}$$

$$\rightarrow F\text{min} \geq BW\text{max-baseband}$$

$$\rightarrow F\text{min} \geq 1 \text{ MHz}$$

According to Carson's Rule, the FMCW signal has an excess bandwidth of 25%. An additional margin of 25% can be provided for filtering considerations. Such amounts can be included to arrive at the following relationships:

$$\rightarrow F\text{min} \geq 2BW\text{max-baseband}$$

$$\rightarrow F\text{min} \geq 2 \text{ MHz}$$

Fmax can theoretically go up to, for example, 5 MHz. However, it can be limited to 4 MHz in practice to avoid the anti-aliasing filter's attenuation at corner frequencies. Such a limitation yields the following expression:

$$\rightarrow F\text{min} - F\text{max} = [2 \text{ MHz} - 4 \text{ MHz}]$$

Figure 6:
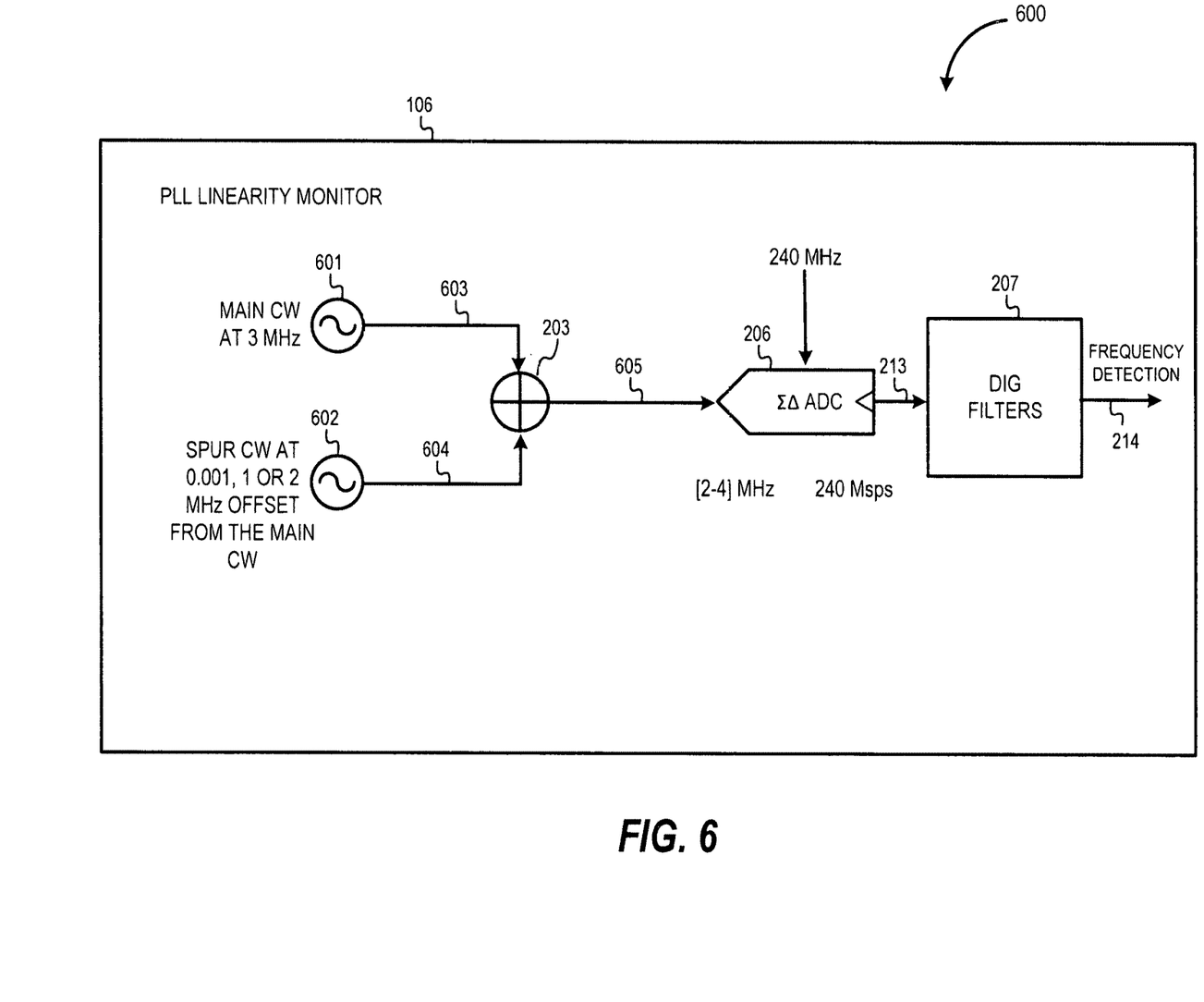
FIG. 6 is a block diagram of a portion of a chirp linearity monitor in accordance with at least one embodiment for modeling harmonic mixing phenomena.

FIG. 6 is a block diagram of a portion of a chirp linearity monitor in accordance with at least one embodiment for modeling harmonic mixing phenomena. As such, the elements of FIG. 6, such as spur CW signal source 602, need not be explicitly instantiated in a practical implementation but can be understood symbolically in configuring the performance of a practical implementation. Portion 600 of PLL linearity monitor 106 comprises a main continuous wave (CW) signal source 601, a spur CW signal source 602, a combiner 203, a sigma-delta (ΣΔ) analog-to-digital converter (ADC) 206, and digital filters 207. Main CW signal source 601 is connected to combiner 203 via main CW signal source output 603. Spur CW signal source is connected to combiner 203 via spur CW signal source output 604. Combiner 203 provides its combiner output 605 to ΣΔ ADC 206. ΣΔ ADC 206 receives a clock signal, such as a 240-MHz clock signal, to drive its sequence of data conversion operations. ΣΔ ADC 206 provides its digitized output signal 213 to digital filters 207. Digital filters 207 provide a frequency detection output 214.

Effects of harmonic mixing signal level on frequency measurement can be considered according to the configuration shown in FIG. 6. Non-modulated CW signals can be considered in such analysis. Three different spurious offsets can be considered, for example, as follow: 1 kHz (overlapping with the wanted signal), 1 MHz (intermediate), and 2 MHz (maximum offset defined in the requirements).

It can be observed that below a certain level of the spur signal, measurement accuracy saturates, limited by ADC performances. The effect of the spurs increases with the frequency offset. Indeed, the following can be shown when measuring CW:

$f\text{measured} \approx f\text{cw} + \alpha \cdot f\text{beat}$, where $f\text{beat} = (f\text{cw} - f\text{spur})/2$ Saturation is reached at a spur level of −55 dBc in the worst case (e.g., 2 MHz offset). After that, the spurs start to be filtered out by demodulator's filters.

Spurious effect on modulated frequency signals differs from the CW case in two respects. Harmonic mixing signal is spread over n times the original band, and, therefore, its power density is reduced by 10*log(n), where n is the RF harmonic order. Harmonic mixing signal appears periodically and for a short amount of time (n times faster than the IF signal) given the FMCW modulation.

A worst case can be considered to derive filtering requirements. For example, for 10×RF-9×LO, the intrinsic level of ~46 dBc (for CW) can be considered. A $1^{st}$ order filter already provides the best measurement accuracy. Other limiting factors become significant (e.g., ADC noise, etc.) beyond that level of filtering. As a result, harmonic mixing products should be kept well below −55 dBc, and, based on observations, such a practice will allow maximum measurement accuracy to be obtained.

Figure 7:
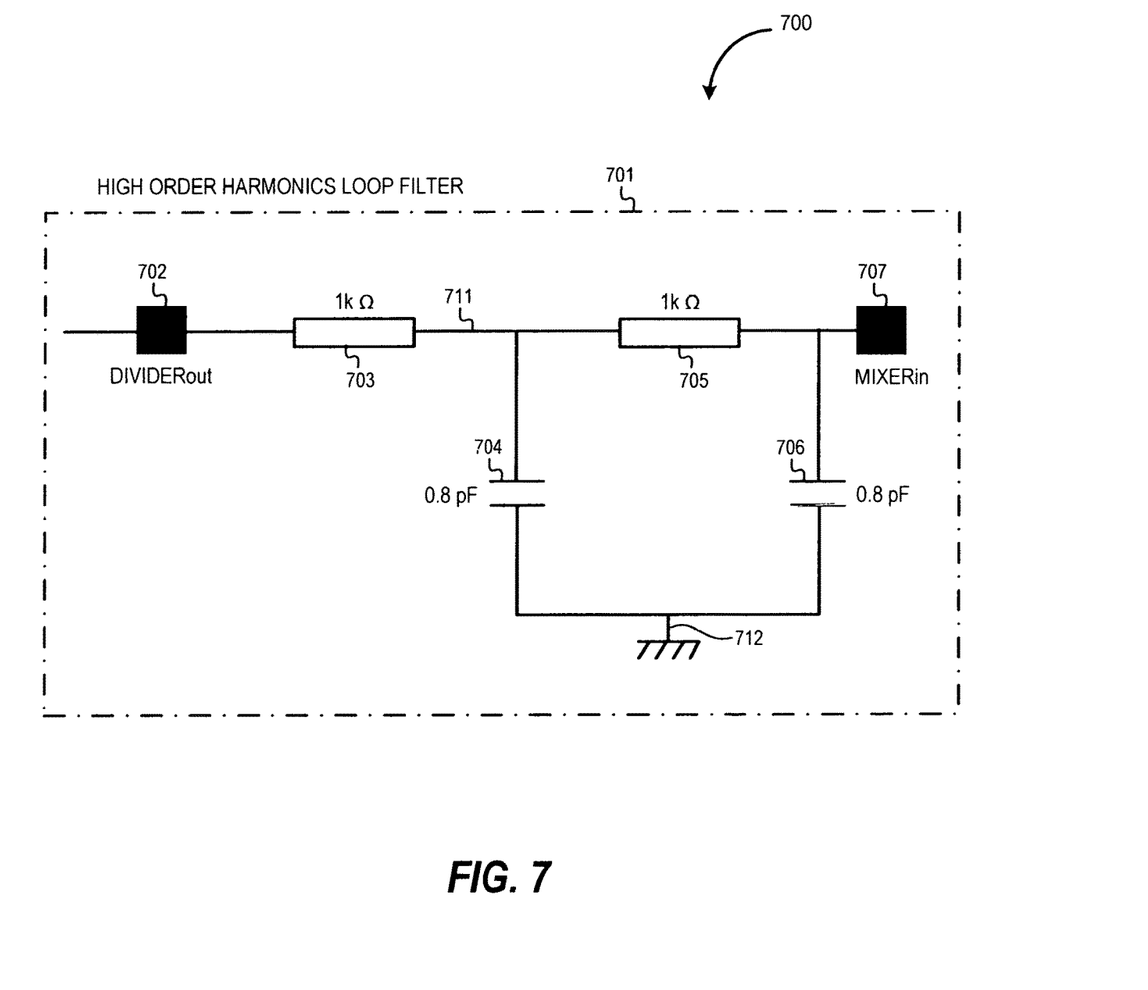
FIG. 7 is a schematic diagram of a harmonics loop filter for use with a chirp linearity monitor in accordance with at least one embodiment.

FIG. 7 is a schematic diagram of a harmonics loop filter for use with a chirp linearity monitor in accordance with at least one embodiment. Harmonics loop filter diagram 700 depicts harmonics loop filter 701. Harmonics loop filter 701 comprises frequency divider output node 702, resistor 703, capacitor 704, resistor 705, capacitor 706, and mixer input node 707. Frequency divider output node 702 is connected to a first terminal of resistor 703. A second terminal of resistor 703 is connected to node 711. Node 711 is connected to a first terminal of capacitor 704 and to a first terminal of resistor 705. A second terminal of resistor 705 is connected to a first terminal of capacitor 706 and to mixer input node 707. A second terminal of capacitor 704 and a second terminal of capacitor 706 are connected to ground potential 712.

As shown in FIG. 7, a second order filter could be practically used to avoid using a level shifter and to put all harmonics above a given order (e.g., 10th order) under a specified limit (e.g., −55 dBc). Thus, the desired immunity to harmonic mixing can be provided using a simple, easily practicable circuit.

Figure 8:
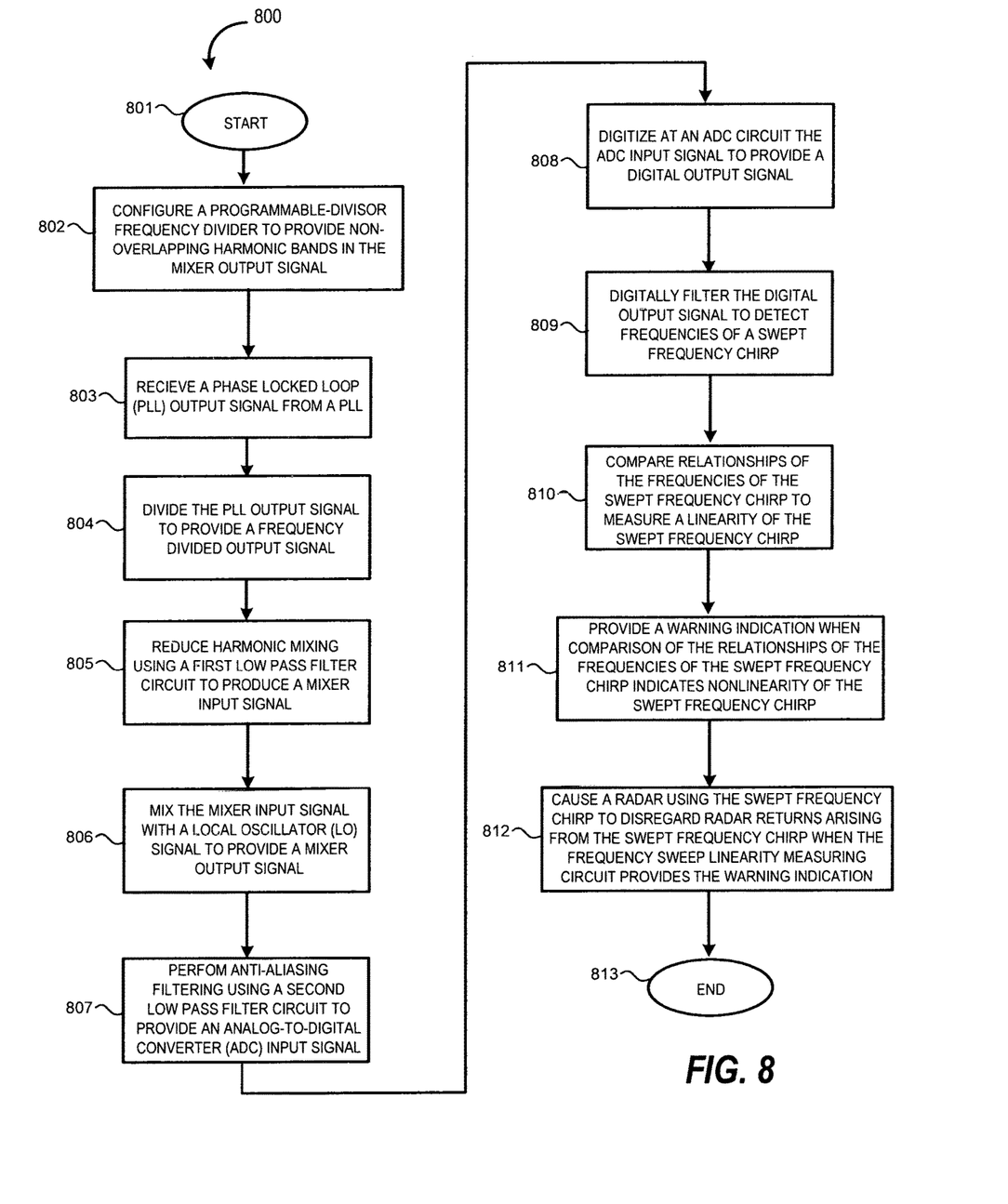
FIG. 8 is a flow diagram illustrating a method in accordance with at least one embodiment.

FIG. 8 is a flow diagram illustrating a method in accordance with at least one embodiment. Method 800 begins at block 801. From block 801, method 800 continues to block 802. At block 802, the chirp linearity monitor configures a programmable-divisor frequency divider to provide non-overlapping harmonic bands in the mixer output signal. From block 802, method 800 continues to block 803. At block 803, a chirp linearity monitor receives a signal source output signal, such as a phase locked loop (PLL) output signal from a PLL. From block 803, method 800 continues to block 804. At block 804, the chirp linearity monitor divides the frequency of the signal source output signal to provide a frequency divided output signal. From block 804, method 800 continues to block 805. At block 805, the chirp linearity monitor reduces harmonic mixing using a first low pass filter circuit to produce a mixer input signal.

From block 805, method 800 continues to block 806. At block 806, the chirp linearity monitor mixes the mixer input signal with a local oscillator (LO) signal to provide a mixer output signal. From block 806, method 800 continues to block 807. At block 807, the chirp linearity monitor performs anti-aliasing filtering using a second low pass filter circuit to provide an analog-to-digital converter (ADC) input signal. From block 807, method 800 continues to block 808. At block 808, the chirp linearity monitor digitizes, at an ADC circuit, the ADC input signal to provide a digital output signal. From block 808, method 800 continues to block 809. At block 809, the chirp linearity monitor digitally filters the digital output signal to detect frequencies of a swept frequency chirp. From block 809, method 800 continues to block 810. At block 810, the chirp linearity monitor compares relationships of the frequencies of the swept frequency chirp to measure a linearity of the swept frequency chirp. From block 810, method 800 continues to block 811. At block 811, the chirp linearity monitor provides a warning indication when comparison of the relationships of the frequencies of the swept frequency chirp indicates nonlinearity of the swept frequency chirp. From block 811, method 800 continues to block 812. At block 812, the chirp linearity monitor causes a radar using the swept frequency chirp to disregard radar returns arising from the swept frequency chirp when the frequency sweep linearity measuring circuit provides the warning indication. From block 812, method 800 continues to block 813, where method 800 ends.

In accordance with at least one embodiment, method 800 comprises performing, using a programmable-divisor frequency divider, frequency division according to a programmable divisor value. In accordance with at least one embodiment, method 800 comprises providing, using a duty cycle adjustment circuit coupled to the programmable-divisor frequency divider, a 50% duty cycle for the frequency divided output signal.

In accordance with at least one embodiment, a chirp linearity detector comprises a frequency sampling circuit and a frequency sweep linearity measuring circuit. The frequency sweep linearity measuring circuit is coupled to the frequency sampling circuit. The frequency sampling circuit comprises a frequency divider circuit for receiving a frequency source output signal from a frequency source and for providing a frequency divided output signal. The frequency sampling circuit further comprises a first low pass filter circuit coupled to the frequency divider circuit. The first low pass filter circuit is provided for receiving the frequency divided output signal, for reducing harmonic mixing, and for providing a mixer input signal. The frequency sampling circuit further comprises a mixer circuit coupled to the first low pass filter circuit. The mixer circuit is provided for receiving the mixer input signal, for mixing the mixer input signal with a local oscillator signal, and for providing a mixer output signal. The frequency sampling circuit further comprises a second low pass filter circuit coupled to the mixer circuit. The second low pass filter circuit is provided for receiving the mixer output signal, for performing anti-aliasing filtering, and for providing an analog-to-digital converter (ADC) input signal. The frequency sampling circuit further comprises an ADC circuit coupled to the second low pass filter circuit. The ADC circuit is provided for receiving the ADC input signal, for digitizing the ADC input signal, and for providing a digital output signal.

In accordance with at least one embodiment, the frequency sweep linearity measuring circuit comprises a digital filter circuit coupled to the ADC circuit. The digital filter circuit is provided for receiving the digital output signal and for detecting frequencies of a swept frequency chirp. In accordance with at least one embodiment, the frequency sweep linearity measuring circuit compares relationships of the frequencies of the swept frequency chirp to measure a linearity of the swept frequency chirp. In accordance with at least one embodiment, the frequency sweep linearity measuring circuit provides a warning indication when comparison of the relationships of the frequencies of the swept frequency chirp indicates nonlinearity of the swept frequency chirp. In accordance with at least one embodiment, a radar using the swept frequency chirp is configured to disregard radar returns arising from the swept frequency chirp when the frequency sweep linearity measuring circuit provides the warning indication. In accordance with at least one embodiment, a local oscillator frequency of the local oscillator signal is configured to provide non-overlapping harmonic bands in the mixer output signal. In accordance with at least one embodiment, a programmable-divisor frequency divider is provided for performing frequency division according to a programmable divisor value, and a duty cycle adjustment circuit is coupled to the programmable-divisor frequency divider for providing a 50% duty cycle for the frequency divided output signal. In accordance with at least one embodiment, the frequency source output signal is a phase locked loop (PLL) output signal received a PLL as the frequency source. The frequency source output signal is a PLL output signal, which is received from a phase-locked loop (PLL) representing the frequency source.

In accordance with at least one embodiment, a method comprises receiving a frequency source output signal from a frequency source; adjusting a frequency divisor in accordance with an analog-to-digital converter (ADC) input frequency range of an ADC; dividing the frequency source output signal according to the frequency divisor to provide a frequency divided output signal; reducing harmonic mixing using a first low pass filter circuit to produce a mixer input signal; mixing the mixer input signal with a local oscillator (LO) signal to provide a mixer output signal; performing anti-aliasing filtering using a second low pass filter circuit to provide an analog-to-digital converter (ADC) input signal; digitizing, at an ADC circuit, the ADC input signal to provide a digital output signal. In accordance with at least one embodiment, the method further comprises digitally filtering the digital output signal to detect frequencies of a swept frequency chirp. In accordance with at least one embodiment, the method further comprises comparing relationships of the frequencies of the swept frequency chirp to measure a linearity of the swept frequency chirp. In accordance with at least one embodiment, the method further comprises providing a warning indication when comparison of the relationships of the frequencies of the swept frequency chirp indicates nonlinearity of the swept frequency chirp. In accordance with at least one embodiment, the method further comprises causing a radar using the swept frequency chirp to disregard radar returns arising from the swept frequency chirp when the frequency sweep linearity measuring circuit provides the warning indication. In accordance with at least one embodiment, the method further comprises configuring a local oscillator frequency of the local oscillator signal to provide non-overlapping harmonic bands in the mixer output signal. In accordance with at least one embodiment, the dividing the frequency source output signal to provide a frequency divided output signal comprises performing frequency division according to a programmable divisor value; and providing a 50% duty cycle for the frequency divided output signal. In accordance with at least one embodiment, the frequency source output signal is a phase locked loop (PLL) output signal received a PLL as the frequency source. The frequency source output signal is a PLL output signal, which is received from a phase-locked loop (PLL) representing the frequency source.

In accordance with at least one embodiment, an integrated circuit comprises a phase-locked loop (PLL) frequency sampling circuit and a frequency sweep linearity measuring circuit. The frequency sweep linearity measuring circuit is coupled to the PLL frequency sampling circuit. The PLL frequency sampling circuit comprises a frequency divider circuit for receiving a PLL output signal from a PLL and for providing a frequency divided output signal. The PLL frequency sampling circuit further comprises a first low pass filter circuit coupled to the frequency divider circuit. The first low pass filter circuit is provided for receiving the frequency divided output signal, for reducing harmonic mixing, and for providing a mixer input signal. The PLL frequency sampling circuit further comprises a mixer circuit coupled to the first low pass filter circuit. The mixer circuit is provided for receiving the mixer input signal, for mixing the mixer input signal with a local oscillator signal, and for providing a mixer output signal. The PLL frequency sampling circuit further comprises a second low pass filter circuit coupled to the mixer circuit. The second low pass filter circuit is provided for receiving the mixer output signal, for performing anti-aliasing filtering, and for providing an analog-to-digital converter (ADC) input signal. The PLL frequency sampling circuit further comprises an ADC circuit coupled to the second low pass filter circuit. The ADC circuit is provided for receiving the ADC input signal, for digitizing the ADC input signal, and for providing a digital output signal.

In accordance with at least one embodiment, the frequency sweep linearity measuring circuit comprises a digital filter circuit coupled to the ADC circuit. The digital filter circuit is provided for receiving the digital output signal and for detecting frequencies of a swept frequency chirp. In accordance with at least one embodiment, the frequency sweep linearity measuring circuit compares relationships of the frequencies of the swept frequency chirp to measure a linearity of the swept frequency chirp. In accordance with at least one embodiment, the frequency sweep linearity measuring circuit provides a warning indication when comparison of the relationships of the frequencies of the swept frequency chirp indicates nonlinearity of the swept frequency chirp. In accordance with at least one embodiment, a radar using the swept frequency chirp is configured to disregard radar returns arising from the swept frequency chirp when the frequency sweep linearity measuring circuit provides the warning indication. In accordance with at least one embodiment, a local oscillator frequency of the local oscillator signal is configured to provide non-overlapping harmonic bands in the mixer output signal.

While the above description refers to an example wherein a signal source for providing a controllable oscillating signal from which operational frequencies, such as a transmit frequency, may be obtained is implemented as a PLL, it should be appreciated that other forms of signal source may be employed in place of PLL 105. Swept frequencies of such a signal source may be monitored as described herein with respect to a PLL.

While the frequency sweep characteristic of a chirp that may be monitored according to the present disclosure is described with respect to a frequency sweep occurring at a constant rate over the duration of the chirp, it should be appreciated that the frequency sweep characteristic may be occur at a different rate, such as an increasing rate or a decreasing rate over the duration of the chirp. Thus, as examples, implementations may be practiced with chirps such as linear chirps, exponential chirps, chirps conforming to other monotonically increasing or monotonically decreasing curves, and coded chirps. It should be understood that the frequency sweep linearity measuring circuit may be configured in accordance with such characteristics to provide a measurement of conformance of a chirp to such characteristics. It should also be appreciated that all chirps need not be identical and need not conform to the same characteristic. As an example, shorter-duration, lower-resolution chirps may be used in conjunction with longer-duration, higher-resolution chirps, for example, to optimize rapidity of acquisition and precision of spatial information acquired. As another example, different rates and characteristics may be used to extend the useful range over which targets may be acquired. The chirp linearity detector may be configured to adapt to such different rates and characteristics as such diverse chirps are produced.

The concepts of the present disclosure have been described above with reference to specific embodiments. However, one of ordinary skill in the art will appreciate that various modifications and changes can be made without departing from the scope of the present disclosure as set forth in the claims below. In particular, the frequencies, divisors, bandwidths, and so on may be implemented using different values. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A chirp linearity detector comprising:
  a frequency sampling circuit; and
  a frequency sweep linearity measuring circuit, the frequency sweep linearity measuring circuit coupled to the frequency sampling circuit, the frequency sampling circuit comprising:
    a programmable-divisor frequency divider circuit for receiving a frequency source output signal from a frequency source, for performing frequency division according to a programmable divisor value, and for providing a frequency divided output signal;
    a first low pass filter circuit coupled to the programmable-divisor frequency divider circuit, the first low pass filter circuit for receiving the frequency divided output signal, for reducing harmonic mixing, and for providing a mixer input signal;
    a mixer circuit coupled to the first low pass filter circuit, the mixer circuit for receiving the mixer input signal, for mixing the mixer input signal with a local oscillator signal, and for providing a mixer output signal;
    a second low pass filter circuit coupled to the mixer circuit, the second low pass filter circuit for receiving the mixer output signal, for performing anti-aliasing filtering, and for providing an analog-to-digital converter (ADC) input signal; and
    an ADC circuit coupled to the second low pass filter circuit, the ADC circuit for receiving the ADC input signal, for digitizing the ADC input signal, and for providing a digital output signal.

2. The chirp linearity detector of claim 1, wherein the frequency sweep linearity measuring circuit comprises:
  a digital filter circuit coupled to the ADC circuit, the digital filter circuit for receiving the digital output signal and for detecting frequencies of a swept frequency chirp.

3. The chirp linearity detector of claim 1, wherein the frequency sweep linearity measuring circuit compares relationships of the frequencies of the swept frequency chirp to measure a linearity of the swept frequency chirp.

4. The chirp linearity detector of claim 1, wherein the frequency sweep linearity measuring circuit provides a warning indication when comparison of the relationships of the frequencies of the swept frequency chirp indicates nonlinearity of the swept frequency chirp.

5. The chirp linearity detector of claim 1, wherein a radar using the swept frequency chirp is configured to disregard radar returns arising from the swept frequency chirp when the frequency sweep linearity measuring circuit provides the warning indication.

6. The chirp linearity detector of claim 1, wherein a local oscillator frequency of the local oscillator signal is configured to provide non-overlapping harmonic bands in the mixer output signal.

7. The chirp linearity detector of claim 1, wherein the programmable-divisor frequency divider circuit comprises:
  a duty cycle adjustment circuit coupled to the programmable-divisor frequency divider for providing a 50% duty cycle for the frequency divided output signal.

8. A method comprising:
  receiving a phase locked loop (PLL) output signal from a PLL;
  adjusting a frequency divisor in accordance with an analog-to-digital converter (ADC) input frequency range of an ADC;
  dividing the PLL output signal according to the frequency divisor to provide a frequency divided output signal;
  reducing harmonic mixing using a first low pass filter circuit to produce a mixer input signal;
  mixing the mixer input signal with a local oscillator (LO) signal to provide a mixer output signal;
  performing anti-aliasing filtering using a second low pass filter circuit to provide an analog-to-digital converter (ADC) input signal; and
  digitizing, at an ADC circuit, the ADC input signal to provide a digital output signal.

9. The method of claim 8, further comprising:
  digitally filtering the digital output signal to detect frequencies of a swept frequency chirp.

10. The method of claim 8, further comprising:
  comparing relationships of the frequencies of the swept frequency chirp to measure a linearity of the swept frequency chirp.

11. The method of claim 8, further comprising:
  providing a warning indication when comparison of the relationships of the frequencies of the swept frequency chirp indicates nonlinearity of the swept frequency chirp.

12. The method of claim 8, further comprising:
  causing a radar using the swept frequency chirp to disregard radar returns arising from the swept frequency chirp when the frequency sweep linearity measuring circuit provides the warning indication.

13. The method of claim 8, further comprising:
  configuring a local oscillator frequency of the local oscillator signal to provide non-overlapping harmonic bands in the mixer output signal.

14. The method of claim 8, wherein the dividing the PLL output signal to provide a frequency divided output signal comprises:
 performing frequency division according to a programmable divisor value; and
 providing a 50% duty cycle for the frequency divided output signal.

15. An integrated circuit comprising:
 a phase-locked loop (PLL) frequency sampling circuit; and
 a frequency sweep linearity measuring circuit, the frequency sweep linearity measuring circuit coupled to the PLL frequency sampling circuit, the PLL frequency sampling circuit comprising:
  a programmable-divisor frequency divider circuit for receiving a PLL output signal from a PLL, for performing frequency division according to a programmable divisor value, and for providing a frequency divided output signal;
  a first low pass filter circuit coupled to the programmable-divisor frequency divider circuit, the first low pass filter circuit for receiving the frequency divided output signal, for reducing harmonic mixing, and for providing a mixer input signal;
  a mixer circuit coupled to the first low pass filter circuit, the mixer circuit for receiving the mixer input signal, for mixing the mixer input signal with a local oscillator signal, and for providing a mixer output signal;
  a second low pass filter circuit coupled to the mixer circuit, the second low pass filter circuit for receiving the mixer output signal, for performing anti-aliasing filtering, and for providing an analog-to-digital converter (ADC) input signal; and
  an ADC circuit coupled to the second low pass filter circuit, the ADC circuit for receiving the ADC input signal, for digitizing the ADC input signal, and for providing a digital output signal.

16. The integrated circuit of claim 15, wherein the frequency sweep linearity measuring circuit comprises:
 a digital filter circuit coupled to the ADC circuit, the digital filter circuit for receiving the digital output signal and for detecting frequencies of a swept frequency chirp.

17. The integrated circuit of claim 15, wherein the frequency sweep linearity measuring circuit compares relationships of the frequencies of the swept frequency chirp to measure a linearity of the swept frequency chirp.

18. The integrated circuit of claim 15, wherein the frequency sweep linearity measuring circuit provides a warning indication when comparison of the relationships of the frequencies of the swept frequency chirp indicates nonlinearity of the swept frequency chirp.

19. The integrated circuit of claim 15, wherein a radar using the swept frequency chirp is configured to disregard radar returns arising from the swept frequency chirp when the frequency sweep linearity measuring circuit provides the warning indication.

20. The integrated circuit of claim 15, wherein a local oscillator frequency of the local oscillator signal is configured to provide non-overlapping harmonic bands in the mixer output signal.

* * * * *